United States Patent [19]

Nagatomi

[11] Patent Number: 4,509,198
[45] Date of Patent: Apr. 2, 1985

[54] SATELLITE BROADCAST SIGNAL RECEIVING SYSTEM

[75] Inventor: Akihiko Nagatomi, Kobe, Japan

[73] Assignee: DX Antenna Company, Limited, Kobe, Japan

[21] Appl. No.: 421,083

[22] Filed: Sep. 22, 1982

[30] Foreign Application Priority Data

Oct. 19, 1981 [JP] Japan .................... 56-155916[U]

[51] Int. Cl.³ .................... H04N 7/16; H04B 3/44
[52] U.S. Cl. ............................ 455/4; 358/86; 455/6; 455/131; 455/189; 455/190
[58] Field of Search .......... 455/3, 4, 6, 189, 190, 455/275, 131; 358/86, 83

[56] References Cited

U.S. PATENT DOCUMENTS 2,815,440 12/1957 Fletcher ........................... 358/86
3,242,433 3/1966 Carlson et al. ................ 455/190
3,839,676 10/1974 Linnecar .
4,205,269 5/1980 Watanabe ......................... 455/4

Primary Examiner—Marc E. Bookbinder
Attorney, Agent, or Firm—Eugene E. Geoffrey, Jr.

[57] ABSTRACT

A satellite broadcast signal receiving system for receiving a plurality of signals of individual transmission bands, which are mutually different in frequency and/or polarization angle, transmitted through an artificial satellite, wherein the signals picked up by an antenna or antennas are first applied to a plurality of outdoor units each corresponding to one transmission band and comprising a convertor for converting the incoming signal into an IF signal, and the converted IF signals are then applied through a change-over switch to a common indoor unit including a demodulator to be demodulated for application to a conventional television set or the like.

3 Claims, 4 Drawing Figures

SATELLITE BROADCAST SIGNAL RECEIVING SYSTEM

This invention relates to a satellite broadcast signal receiving system used for receiving a plurality of signals of individual bands, which are different mutually in frequency and/or polarization angle, transmitted through an artificial satellite for application to a conventional home television set or the like.

Broadcast signals transmitted through an artificial satellite at very high frequencies are generlly amplified and otherwise processed by a particular device after received by an antenna or antennas and prior to application to a conventional home television set or the like. The device is composed of an outdoor unit generally associated with the antenna and an indoor unit generally associated with the television set or the like, and both units are coupled through a coaxial cable. An example of the device is shown in U.S. Pat. No. 3,839,676 granted Oct. 1, 1974 to Linnecar. The broadcast signals have their own transmission bands which are different mutually in frequency and/or polarization angle, for example. In the prior art systems, a single device including outdoor and indoor units has been used exclusively for each transmission band, and, therefore, not only the output units but also the indoor units must have the same number as the transmission bands for receiving all of the transmitted signals. However, such systems will become more and more massive and expensive with increase of the transmission bands and, therefore, unsuitable for entertainment use.

Accordingly, an object of this invention is to provide an improved structure of such a system for receiving and processing a plurality of satellite broadcast signals, which is significantly simpler and cheaper than the prior art ones.

This object can be attained by a satellite broadcast signal receiving system according to this invention, which includes a plurality of outdoor units for converting the respective satellite broadcast signals into intermediate frequency (IF) signals, and a common indoor unit coupled to receive said IF signals at its input through coaxial cables corresponding respectively to said outdoor units. The common indoor unit is arranged to allow operating current to be supplied from its input to the outdoor units through the respective coaxial cables, and a change-over switch is disposed between said input and said coaxial cables.

Now, the description will be made in more detail hereinunder with reference to the accompanying drawings.

IN THE DRAWINGS

Throughout the drawings, like reference symbols are used to denote like or corresponding components.

Figure 1:
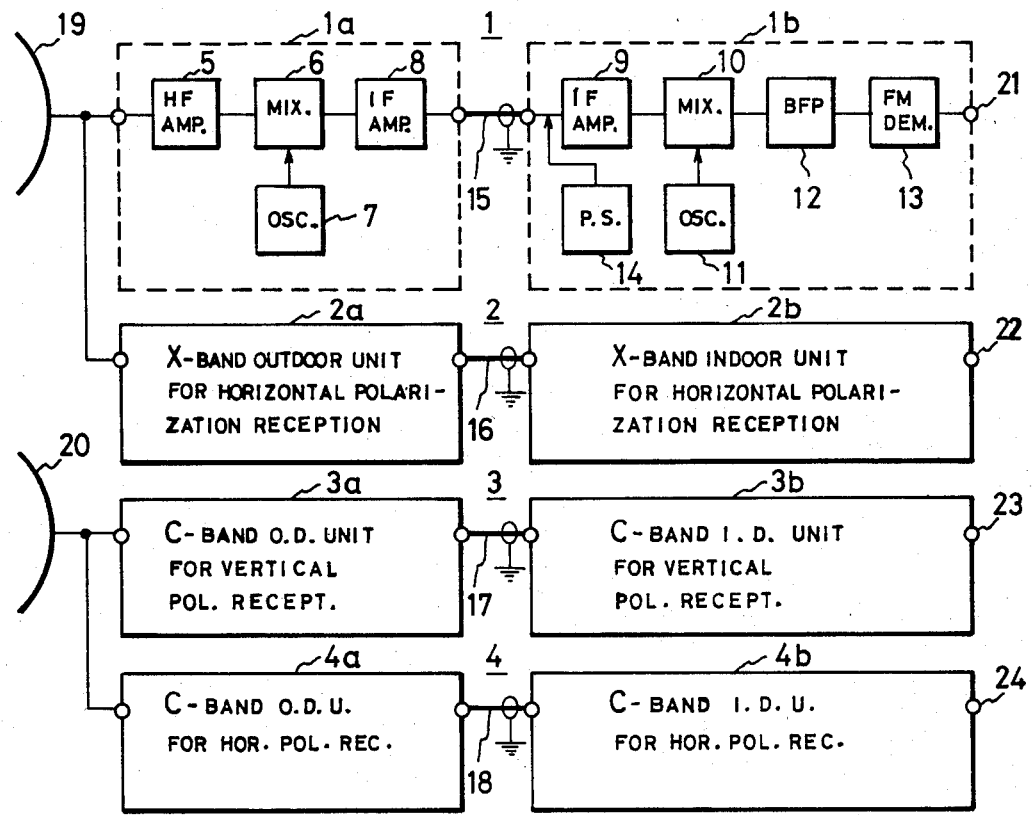
FIG. 1 is a block diagram representing an example of a satellite broadcast signal receiving system according to the prior art.

Referring to FIG. 1, the prior art satellite broadcast signal receiving system includes a vertically polarized X-band broadcast signal receiving section 1, a horizontally polarized X-band broadcast signal receiving section 2, a vertically polarized C-band broadcast signal receiving section 3 and a horizontally polarized C-band broadcast signal receiving section 4. These signal receiving sections 1, 2, 3 and 4 are composed, respectively, of outdoor units 1a, 2a, 3a and 4a and indoor units 1b, 2b, 3b and 4b. As shown in the receiving section 1, each outdoor unit, which serves a function of converting each incoming broadcast signal into an IF signal of common L-band, includes high frequency amplifier 5, first mixer 6, first fixed local oscillator 7 and IF amplifier 8, and each indoor unit includes IF amplifier 9, second mixer 10, second variable local oscillator 11, band-pass filter 12, FM demodulator 13 and power supply 14. The power supplies 14 of the respective indoor units 1b, 2b, 3b and 4b are arranged to supply operating currents to the corresponding outdoor units 1a, 2a, 3a and 4a through coaxial cables 15, 16, 17 and 18, respectively. Parabolic antennas 19 and 20 designed to pick up the broadcast signals from the satellite in X and C-bands, respectively, are coupled to supply these signals to the corresponding outdoor units. Output terminals 21, 22, 23 and 24 of the FM demodulators 13 of the indoor units 1b, 2b, 3b and 4b are to be coupled to a common utilization device, such as home television set, for reproduction or display.

In this system, the indoor units 1b, 2b, 3b and 4b can be identical to each other in circuit configuration since all of the outdoor units 1a, 2a, 3a and 4a provide output signals in the common L-band to the indoor units. The reason why the outdoor units are accompanied with their own indoor units regardless of the above mentioned identity is possible disturbance caused by the broadcast signals other than those to be received. However, it is troublesome and uneconomical to manufacture such system having many indoor units of identical configuration.

Figure 2:
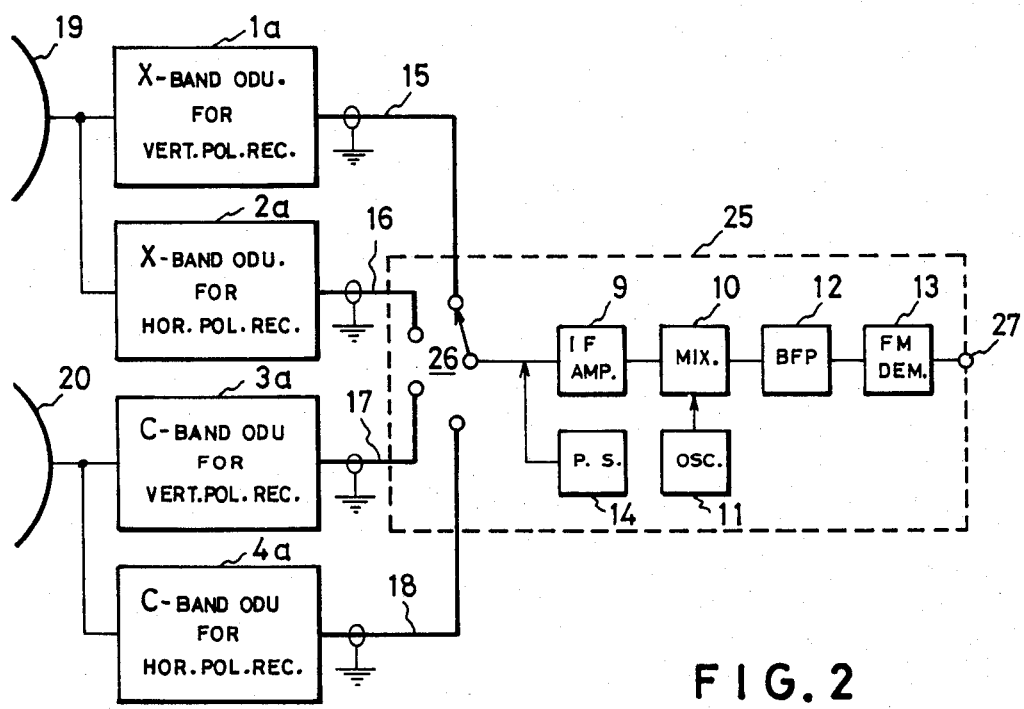
FIG. 2 is a block diagram representing an embodiment of the satellite broadcast signal receiving system according to this invention.

Referring next to FIG. 2 showing an embodiment of this invention, a common indoor unit 25 is provided for the outdoor units 1a, 2a, 3a and 4a. The indoor unit 25 is substantially the same in circuit configuration as the indoor units 1b, 2b, 3b and 4b of FIG. 1 but differs from the latter in that its input is coupled through a change-over switch 26 to the coaxial cables 15, 16, 17 and 18 from the outputs of the outdoor units 1a, 2a, 3a and 4a.

When the indoor unit 25 is coupled through the change-over switch 26 to the outdoor unit 1a, for example, in the arrangement of FIG. 2, operating current from the power supply 14 of the indoor unit 25 is supplied only to the outdoor unit 1a through the change-over switch 26 and the coaxial cable 15. Accordingly, only the outdoor unit 1a is enabled to operate but the other outdoor units 2a, 3a and 4a are disabled operation. A vertically polarized X-band signal reveived by the parabolic antenna 19 is converted into an L-band signal in the outdoor unit 1a and applied through the coaxial cable 15 and the change-over switch 26 to the input of the common indoor unit 25. It is evident that similar operations will be executed when the change-over switch 26 is turned to couple the other outdoor units to the input of the common indoor unit 25, respectively.

As described above, in the system of this invention, the operating current source for the outdoor units is included in the common indoor unit and the operating current is supplied through the change-over switch to one of the outdoor units. Accordingly, the outdoor units having no connection to the broadcast signal to be received cannot operate and, therefore, the signal to be received is never disturbed by the other signals.

Figure 3:
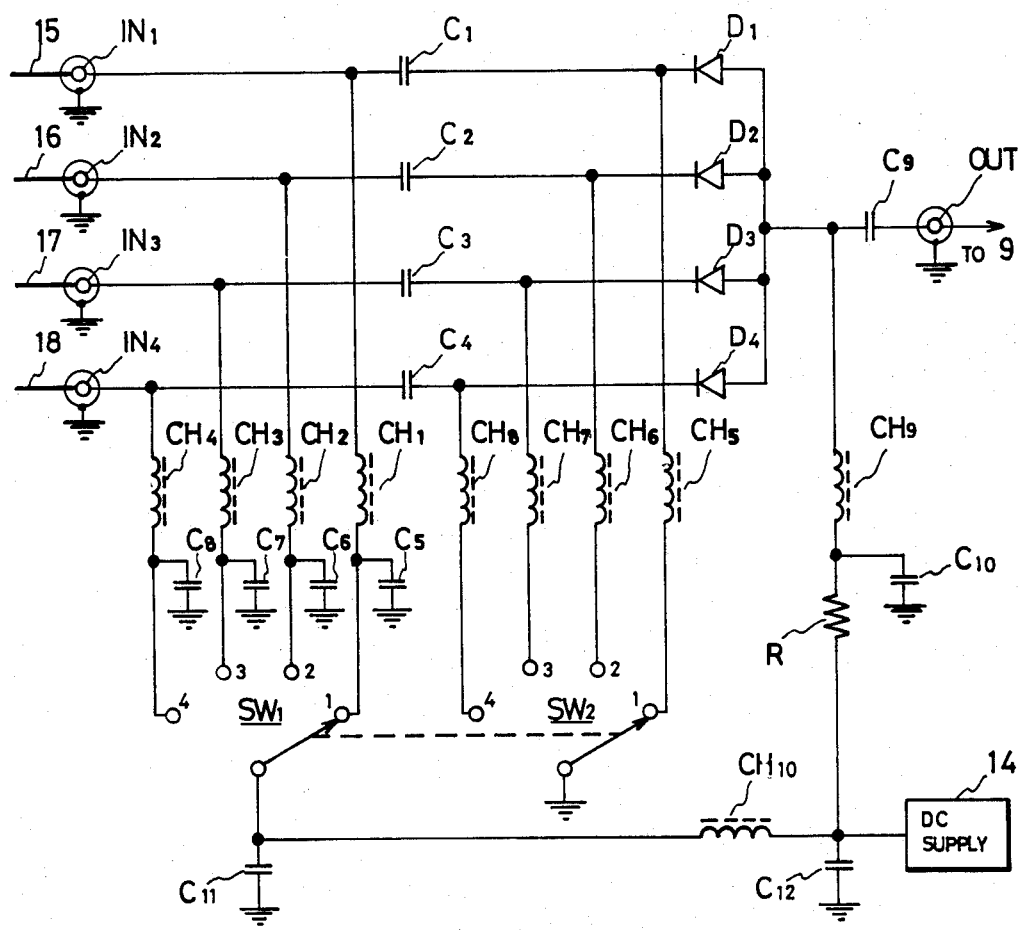
FIG. 3 is a schematic circuit diagram representing an embodiment of the change-over switch used in the system in FIG. 2.
Figure 4:
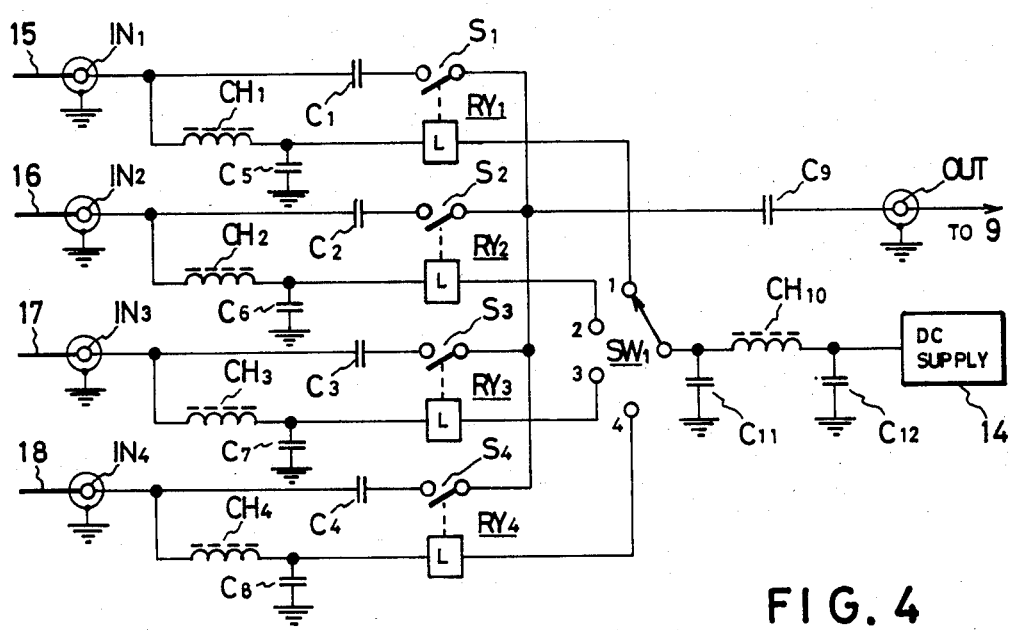
FIG. 4 is a schematic circuit diagram representing another embodiment of the change-over switch usable alternatively in place of the switch of FIG. 3.

FIGS. 3 and 4 show two embodiments of the change-over switch 26 arranged to supply operating current from the common indoor unit to selected one of the outdoor units and, at the same time, pass the received broadcast signal from the selected outdoor unit to the common indoor unit.

In FIG. 3, the coaxial cables 15, 16, 17 and 18 from the outdoor units 1a, 2a, 3a and 4a are coupled to input terminals $IN_1$, $IN_2$, $IN_3$ and $IN_4$, respectively, which are in turn coupled through capacitors $C_1$, $C_2$, $C_3$ and $C_4$ to the cathodes of diodes $D_1$, $D_2$, $D_3$ and $D_4$ whose anodes are coupled in common through a capacitor $C_9$ to the output terminal OUT, that is, the movable arm of the switch 26, which is coupled to the input of IF amplifier 9 of the indoor unit 25. The input terminals $IN_1$, $IN_2$, $IN_3$ and $IN_4$ are also coupled through chokes $CH_1$, $CH_2$, $CH_3$ and $CH_4$ to fixed contacts 1, 2, 3 and 4 of a switch $SW_1$, which are grounded through capacitors $C_5$, $C_6$, $C_7$ and $C_8$, respectively. The cathodes of the diodes $D_1$, $D_2$, $D_3$ and $D_4$ are coupled through chokes $CH_5$, $CH_6$, $CH_7$ and $CH_8$ to fixed contacts 1, 2, 3 and 4 of another switch $SW_2$ which is interlocked with switch $SW_1$. The movable arm of switch $SW_1$ is grounded through a capacitor $C_{11}$, while the movable arm of switch $SW_2$ is grounded directly. The movable arm of switch $SW_1$ is also coupled through a choke $CH_{10}$ to the input of DC supply or power supply 14 of the indoor unit 25. The input of DC supply 14 is grounded through a capacitor $C_{12}$ and further coupled through a resistor R and a choke $CH_9$ to the anodes of the diodes $D_1$ through $D_4$. The junction of resistor R and coke $CH_9$ is grounded through a capacitor $C_{10}$.

In operation, when the movable arms of switches $SW_1$ and $SW_2$ are turned to the fixed contacts 1 as shown, DC operating current is supplied from the source 14 through choke $CH_{10}$, switch $SW_1$, choke $CH_1$, input $IN_1$ and coaxial cable 15 to the outdoor unit 1a to operate it. In addition, DC voltage is applied from the source 14 through resistor R and choke $CH_9$ to the anode of diode $D_1$ whose cathode is grounded through choke $CH_5$ and switch $SW_2$, to make this diode conductive. Thus, the high frequency signal processed in the ourdoor unit 1a and applied through coaxial cable 15 to input terminal $IN_1$ is passed through capacitor $C_1$, conductive diode $D_1$ and capacitor $C_9$ to output terminal OUT and applied to the indoor unit 25. As readily understood from the above description, any broadcast signal can be selectively introduced into the indoor unit 25 by turning the two-pole multithrow switch $SW_1$-$SW_2$ to a corresponding contact.

FIG. 4 shows a modification of the circuit of FIG. 3. In FIG. 4, normally-open contacts $S_1$, $S_2$, $S_3$ and $S_4$ of electromagnetic relays $RY_1$, $RY_2$, $RY_3$ and $RY_4$ are inserted in place of diodes $D_1$, $D_2$, $D_3$ and $D_4$ of FIG. 3 and the solenoids L of these relays are respectively inserted between chokes $CH_1$, $CH_2$, $CH_3$ and $CH_4$ and the fixed contacts of switch $SW_1$ of FIG. 3. The switch $SW_2$ has been removed together with chokes $CH_5$ through $CH_9$, resistor R and capacitor $C_{10}$. In operation, when switch $SW_1$ is turned to contact 1, DC current is supplied from the source 14 through this contact to the outdoor unit 1a beyond the input $IN_1$. This current also energizes the solenoid of relay $RY_1$ to close the contact $S_1$, thereby introducing the broadcast signal from the outdoor unit 1a through this closed contact $S_1$ to the indoor unit 25. Thus, the same effect as of the switch arrangement of FIG. 3 is obtained by turning the switch $SW_1$ to a seleced contact.

The above description has been made in conjunction with some examples only for the purpose of explanation and it does not mean the invention is limited thereto. Various modifications and changes can be made by those skilled in the art within the scope of this invention is defined in the appended claim. For example, the invention can be applied to those broadcast signals of clockwise and anticlockwise circular polarizations instead of vertical and horizontal polarizations.

What is claimed is:

1. A broadcast signal receiving system comprising a plurality of outdoor receiving units for receiving a plurality of broadcast signals, and converting them into intermediate frequency signals in a common frequency band, an indoor unit having an input for receiving said intermediate frequency signals from a selected one of said outdoor units, switching means, a plurality of coaxial cables each coupling a respective outdoor unit to said switching means, means for connecting the input of said indoor unit to said switching means, said switching means selectively coupling one of said outdoor units through its associated coaxial cable to the input of said indoor unit via said connecting means, a power supply coupled to the switching means for supplying operating power to said one outdoor unit through the associated coaxial cable, said switching means including conduction path means coupled through said coaxial cables to said outdoor units to supply said operating power thereto through the associated coaxial cables and additional conduction path means for feeding respective ones of said intermediate frequency signals from the associated outdoor units to said indoor unit through said coaxial cables and connecting means, said switching means selectively applying operating power to said one of said plurality of outdoor units, which selective power application enables a respective one of said additional conduction path means to close in order to feed said selected, respective intermediate frequency signal from the selectively powered outdoor unit to said indoor unit.

2. A broadcast signal receiving system according to claim 1 wherein said switching means includes a common capacitor in series with the input to said indoor unit, a plurality of series connected diode/capacitor pairs with each series connected diode/capacitor pair connected between said common capacitor and a respective coaxial cable connected to an associated outdoor unit whereby each diode is positioned in series relationship between two capacitors, a switch including means for applying operating power through at least one inductor via said switch to a selected outdoor unit through the coaxial cable associated therewith and means including at least two frequency isolating inductors for producing a current flow through the diode associated with the selected outdoor unit to effect transmission of the respective intermediate frequency signals from the selected outdoor unit to the indoor unit.

3. A broadcast signal receiving system according to claim 2 wherein said switching means includes a common capacitor in series with the input to said indoor unit, a respective signal current control means associated with each outdoor unit including signal current control means having two terminals and open and closed positions, each of said relay means having one terminal connected to said common capacitor, a series connected capacitor connecting the other terminal of said current control means to the coaxial cable associated with a respective one of said outdoor units, a respective current conducting means having a pair of terminals associated with each current control means to close its respective current control means when current flow therethrough, one terminal of each current conducting means being connected through an inductor to the coaxial cable of the associated outdoor unit, said switching means applying an operating current to the other terminal of a current conducting means for energizing the associated outdoor unit and placing the associated signal current control means in said closed position to feed said selected, respective intermediate frequency signals from the selected outdoor unit to said indoor unit.

* * * * *